United States Patent [19]
Mitra

[11] Patent Number: 5,266,118
[45] Date of Patent: Nov. 30, 1993

[54] VESSEL FOR GROWING THIN FILMS BY ISOTHERMAL VAPOR PHASE EPITAXY

[75] Inventor: Pradip Mitra, Grand Prairie, Tex.

[73] Assignee: Loral Vought Systems Corporation, Grand Prairie, Tex.

[21] Appl. No.: 7,471

[22] Filed: Jan. 22, 1993

[51] Int. Cl.[5] .............................................. C23C 14/24
[52] U.S. Cl. ..................................... 118/726; 118/728
[58] Field of Search ................................. 118/726, 728

[56] References Cited

U.S. PATENT DOCUMENTS

| | | | |
|---|---|---|---|
| 3,462,323 | 8/1969 | Groves | 148/175 |
| 4,447,470 | 5/1984 | Kay | 427/76 |
| 4,762,576 | 8/1988 | Wilson et al. | 156/611 |

OTHER PUBLICATIONS

Wang, Shin, Chu, Lanir and Vanderwyck, "Liquid Phase Growth of HgCdTe Epitaxial Layers", *J. Electrochem. Soc.* 127, pp. 175–179, Jan., 1980.
Shin and Pasko, "Open-Tube Isothermal Vapor Phase Epitaxy of $Hg_{1-x}Cd_xTe$ on CdTe", *Appl. Phys. Lett.*, 44 (4), pp. 423–425, Feb. 15, 1984.
"Semiconductor/Opto-Electronic Grades", published by Poco Graphite, Inc., 4 pages, Mar., 1989.
"Fabmate", published by Poco Graphite, Inc., 2 pages, publication date unknown.

*Primary Examiner*—Richard Bueker
*Attorney, Agent, or Firm*—Richards, Medlock & Andrews

[57] ABSTRACT

A growth vessel (10) comprises a crucible (12) for containing the source materials within its cavity (26), a substrate carrier (15, 115) positioned on inner shoulder 27 of the crucible sidewalls (22–25), a source tray (14) positioned within the crucible cavity (26), at least one spacer (13) positioned between the bottom of the crucible cavity (26) and the source tray (14), a substrate carrier (15, 115) positioned within the crucible cavity (26) for mounting a substrate parallel to the source of growth material in the source tray (14), and a crucible lid (17, 117).

23 Claims, 3 Drawing Sheets

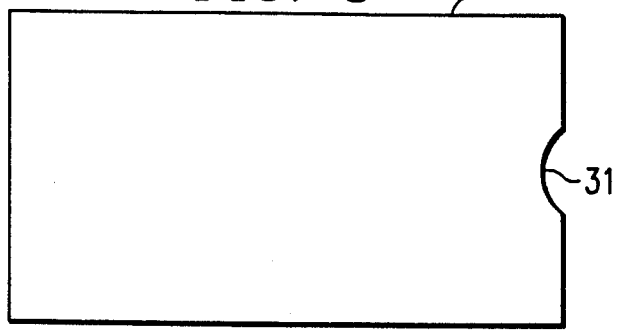
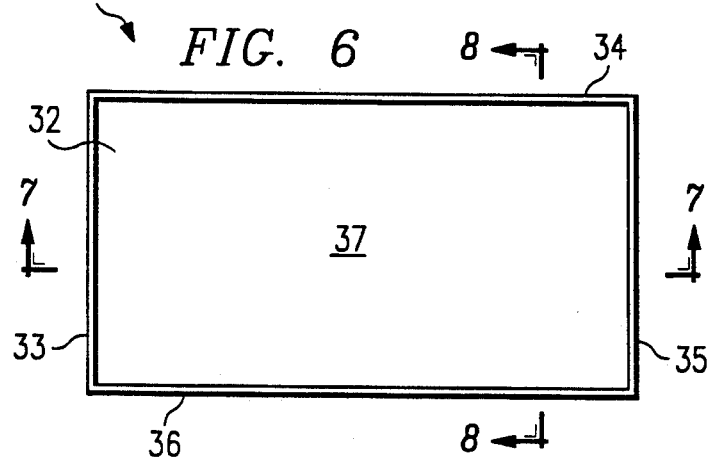
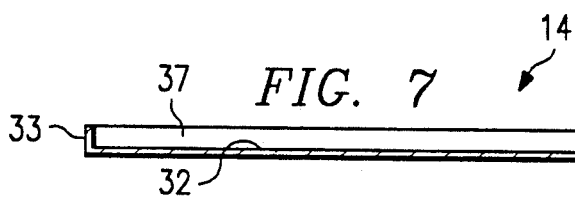
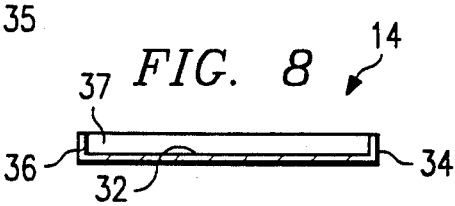
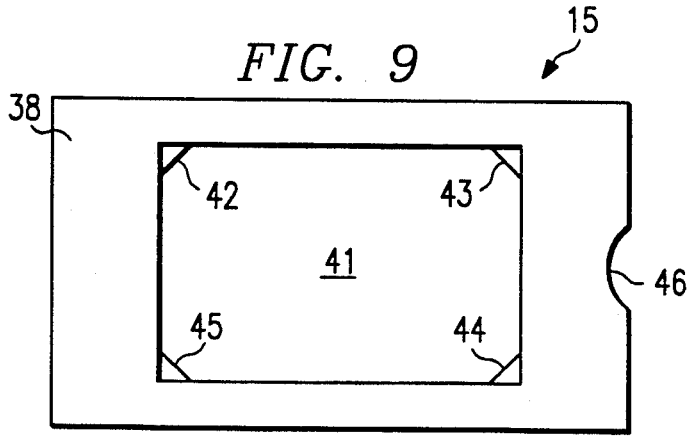

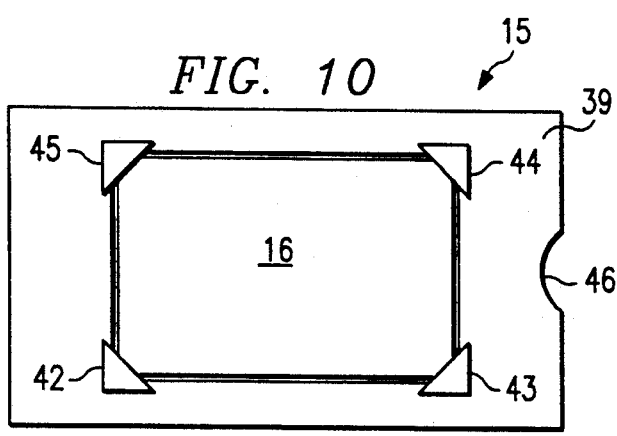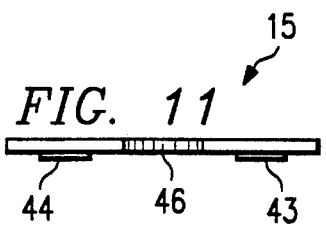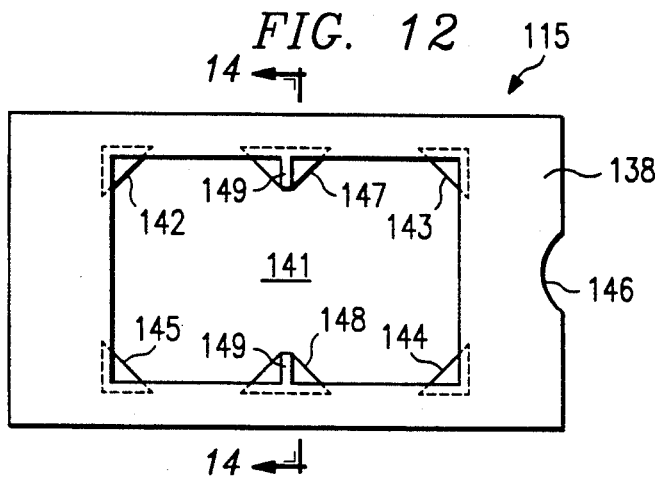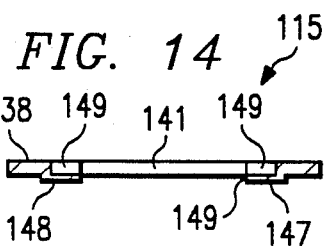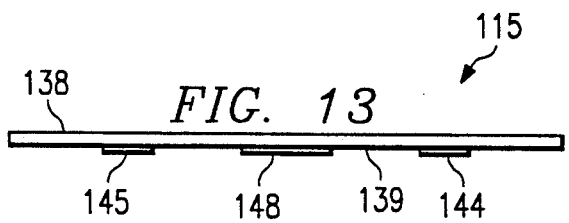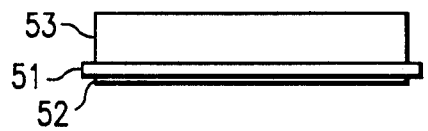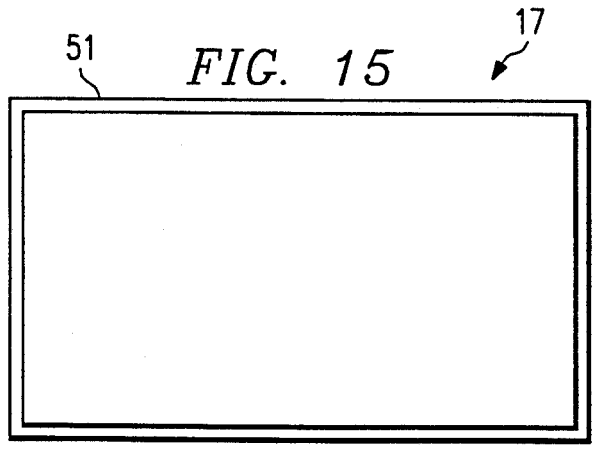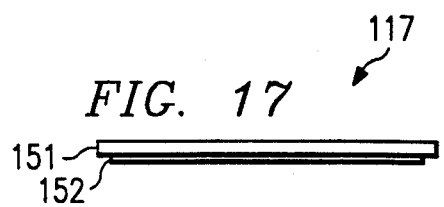

VESSEL FOR GROWING THIN FILMS BY ISOTHERMAL VAPOR PHASE EPITAXY

FIELD OF THE INVENTION

This invention relates to a vessel which is advantageous for growing thin semiconductor films by the isothermal vapor phase epitaxy process.

BACKGROUND OF THE INVENTION

In U.S. Pat. No. 4,762,576, Wilson and Guiterrez disclose a process of high pressure close-space epitaxy in which a reusable, demountable ampule is positioned in a high pressure furnace to provide a growth chamber having a semi-confined atmosphere. This high pressure close-space epitaxy is also known as an isothermal vapor phase epitaxy process. The ampule can be a quartz tube having a removable quartz plug at one end. In order to load the ampule, the plug is removed from the ampule, the growth source elements are loaded in a well within a support structure, a substrate wafer support is positioned on the support structure so that a substrate wafer contained in the substrate wafer support is at a fixed distance from the bottom of the well, the resulting assembly of the support structure and substrate wafer support is inserted into the ampule, and the plug is inserted into the end of the ampule. As such process can involve a series of pressurization, depressurization steps to exchange an inert gas and/or other desired gas for the air originally contained in the well, the substrate wafer support is positioned only very lightly on the support structure. In one embodiment, the substrate wafer support is slidably positioned on the support structure so that the substrate wafer can be moved relative to the growth source elements. The disclosure of U.S. Pat. No. 4,762,576 is incorporated herein in its entirety.

It is desirable that the substrate wafer be accurately positioned with respect to the well containing the source of growth materials so as to provide consistent and reproducible exposure of the surface of the substrate wafer to the vaporized source material in the well from one growth operation to another. Having the substrate wafer support lightly positioned on the support structure so that the substrate wafer support is slidable with respect thereto permits vibration or other forces to cause a horizontal misalignment of the substrate wafer surface and the well containing the vaporized source material.

It is also desirable that the substrate wafer be positionable in the furnace in a reproducible manner so as to avoid variations in the growth of the film due to variations in the temperature profile of the furnace.

It is also desirable that the substrate wafer be accurately positioned with respect to the source of growth materials, with regard to the vertical distance between the surface of the source of growth materials and the surface of the substrate wafer on which the thin semiconductor film is to be grown. Moreover, it is desirable that this vertical distance be changeable from one application to another. While a plurality of support structures could be provided with different well depths, this would involve substantial expense without necessarily providing the desired degree of adjustability.

It is also desirable that the amount of a substrate wafer surface exposed for the growth of the thin semiconductor film be maximized.

SUMMARY OF THE INVENTION

It is an object of the present invention to provide a new and improved vessel which is advantageous for growing thin semiconductor films by the isothermal vapor phase epitaxy process. Another object of the invention is to accurately position the substrate wafer with respect to the chamber containing vaporized source materials and to retain that position during the growth process. Another object of the invention is to provide a flexible means for varying the vertical distance between the upper surface of the source of growth material and the surface of the substrate wafer on which the thin semiconductor film is to be grown. A further object of the invention is to maximize the amount of a substrate wafer surface which can be exposed for the growth of the thin semiconductor film.

In accordance with one aspect of the invention, a crucible for containing the source materials within its cavity is provided with an interior supporting shoulder which is located below the top of the sidewalls and is spaced from and at least substantially parallel to the bottom wall of the crucible, whereby a substrate wafer carrier can be positioned on the interior supporting shoulder so as to be supported thereby with the lower surface of the substrate wafer being parallel to and at a predetermined distance from the bottom wall of the crucible.

In accordance with another aspect of the invention, a source tray is positioned within the cavity of a crucible, a substrate wafer carrier is supported by the crucible walls at a fixed distance above the bottom of the crucible cavity, and one or more spacer elements are positioned in the crucible between the bottom of the cavity and the source tray so that the distance between the substrate wafer surface and the upper surface of the source material in the source tray can be adjusted to a desired distance.

In accordance with another aspect of the invention, the substrate wafer carrier has an opening therein for receiving a substrate wafer, the substrate wafer carrier being provided with a plurality of discrete ledge segments spaced apart from each other and extending inwardly about the periphery of the opening so as to stably support the substrate wafer while increasing the amount of the exposed substrate surface.

BRIEF DESCRIPTION OF THE DRAWINGS

In the drawings.

FIG. 5 is a top view of the spacer element of FIG. 1;

FIG. 6 is a top view of the source tray of FIG. 1;

FIG. 7 is a cross-sectional view along line 7—7 of FIG. 6;

FIG. 8 is a cross-sectional view along line 8—8 of FIG. 6;

FIG. 9 is a top view of the substrate wafer carrier of FIG. 1 without a substrate wafer;

FIG. 10 is a bottom view of the substrate wafer carrier of FIG. 9 with a substrate wafer in place;

FIG. 11 is an end view of the substrate wafer carrier of FIG. 9;

FIG. 12 is a top view of another embodiment of a substrate wafer carrier without any substrate wafers present;

FIG. 13 is a front view of the substrate wafer carrier of FIG. 12;

FIG. 14 is a cross-sectional view along line 14—14 of FIG. 12;

FIG. 15 is a top view of the crucible lid of FIG. 1;

FIG. 16 is a front view of the crucible lid of FIG. 15; and

FIG. 17 is a front view of another embodiment of a crucible lid.

DETAILED DESCRIPTION

Figure 1:
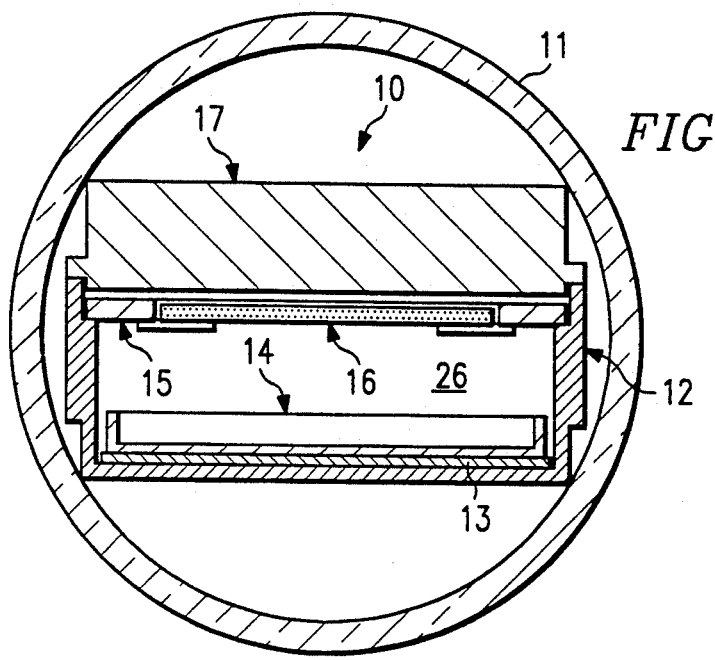
FIG. 1 is a cross-sectional view through a furnace tube containing a growth vessel in accordance with the present invention.
Figure 2:
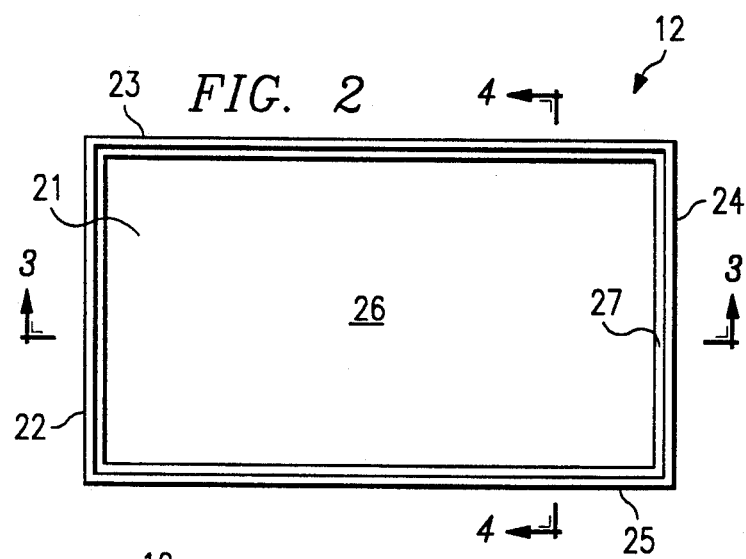
FIG. 2 is a top view of the crucible of FIG. 1.
Figure 3:
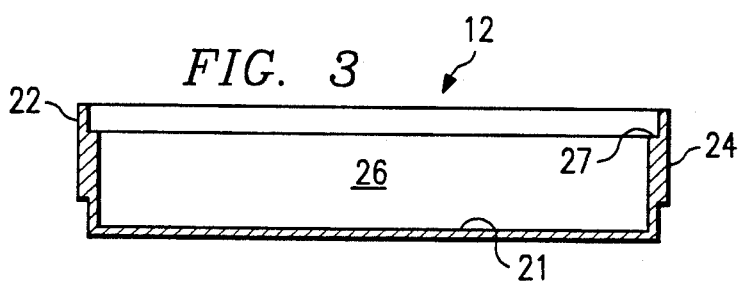
FIG. 3 is a cross-sectional view along line 3—3 of FIG. 2.
Figure 4:
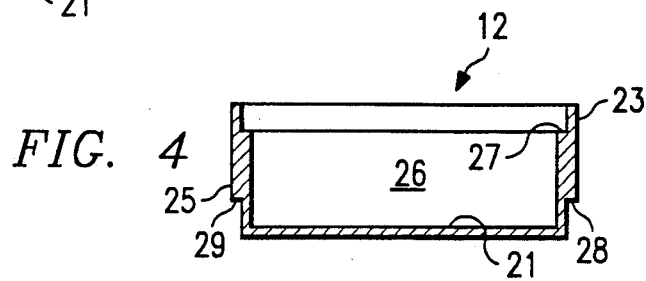
FIG. 4 is a cross-sectional view along line 4—4 of FIG. 2.

Referring now to FIG. 1, a growth vessel 10, constructed in accordance with the present invention, is positioned within a demountable, reusable support in the form of a quartz tube 11. While one end of tube 11 can be sealed with the other end temporarily closed by a removable plug, it is presently preferred for tube 11 to be open at both ends with the growth vessel 10 being positioned between two removable end plugs. The tube 11, containing the growth vessel 10, can be placed in a suitable furnace, such as the furnace described by Wilson and Guiterrez in U.S. Pat. No. 4,762,576.

The growth vessel 10 comprises a crucible 12, at least one spacer 13, a source tray 14 for containing the source of growth materials, a substrate wafer carrier 15 for containing at least one substrate wafer 16, and a crucible lid 17. The growth materials can be present in the source in elemental form or in compound form as desired. As illustrated in FIGS. 1-4, the crucible 12 has a bottom wall 21 and four sidewalls 22, 23, 24 and 25. The sidewalls 22-25 and the bottom wall 21 define a cavity 26 which is at least generally rectangular in configuration. Each of the sidewalls 22-25 is provided with an interior supporting shoulder 27 which is located below the top of the sidewalls 22-25 at a uniform distance from the bottom wall 21. It is presently preferred that the interior supporting shoulder 27 extend continuously about the periphery of cavity 26. The surface of the interior supporting shoulder is preferably at least substantially planar and parallel to the bottom wall 21 of the crucible 12. In order to maximize the lateral dimension of the crucible 12 in the area of the interior supporting shoulder 27, at least the sidewalls 23, 25 which contact the tube 11 have a reduced thickness portion 28, 29 adjacent the bottom wall 21, so that the only contact between the crucible 12 and the tube 11 occurs at the lower edges of sidewalls 23 and 25. In general, the reduced thickness portions 28, 29 will extend around the full periphery of the bottom wall 21.

While each spacer 13 can be an annular element of generally circular or generally rectangular configuration, it is presently preferred that each spacer 13 be in the form of a thin solid sheet of uniform thickness as shown in FIGS. 1 and 5, so that the source tray 14 is supported throughout its length and width by a spacer 13. Preferably, each spacer has a length and width which are only slightly less than the corresponding length and width of cavity 26. Each spacer 13 can be provided with a notch 31 in at least one edge thereof to permit the use of an instrument for inserting the spacer 13 into the cavity 26 and removing the spacer from the cavity 26. When a vertical distance between the upper surface of the source of growth material and the substrate wafer surface is desired that is different from the spacing provided by the growth vessel 10 without a spacer 13, at least one spacer 13 can be positioned within cavity 26 between the top surface of bottom wall 21 and the bottom surface of the source tray 14 so as to reduce the distance between the source tray 14 and the lower surface of the substrate wafer 16 positioned on substrate wafer carrier 15.

As illustrated in FIGS. 1 and 6-8, the source tray 14 has a bottom wall 32 and four sidewalls 33, 34, 35, and 36. The sidewalls 33-36 and the bottom wall 32 define a well 37 for receiving and containing at least one source material to be vaporized in order to provide the material for the formation of the thin film on the substrate wafer 16. The height of the sidewalls 33-36 is sufficient for the growth source materials to be contained within the well 37, with the upper surface of the source material being at least substantially parallel to the bottom wall 32 of the source tray. Preferably, the length and width of the source tray 14 are only slightly less than the corresponding length and width of cavity 26.

As illustrated in FIGS. 1 and 9-11, the substrate wafer carrier 15 has a rectangular configuration with the length and width thereof being greater than the corresponding length and width of cavity 26 at the level of the inner supporting shoulder 27 and only slightly less than the corresponding length and width of cavity 26 at the level immediately above the inner supporting shoulder 27 so that the substrate wafer carrier 15 is positionable within cavity 26 so as to be fully supported by the inner supporting shoulder 27. The substrate wafer carrier 15 has an upper surface 38 and a lower surface 39. The peripheral margins of the bottom surface 39 of the substrate wafer carrier 15 conform to the surface of inner supporting shoulder 27 so as to provide for accurately positioning the lower surface 39 of the substrate wafer carrier 15 parallel to the top surface of the bottom wall 21 of the crucible 12 and thus also to the top surface of the growth source materials in source tray 14.

The substrate wafer carrier 15 has an opening 41 extending therethrough from upper surface 38 to lower surface 39 for the purpose of receiving and holding the substrate wafer 16. The upper portion of opening 41 is of a size to accommodate one substrate wafer 16 therein, with the length and width of the substrate wafer 16 being only slightly less than the corresponding length and width of the upper portion of opening 41. The substrate wafer carrier 15 has at least one retention portion for retaining the substrate wafer 16 within the upper portion of the opening 41 with the lower surface of the substrate wafer 16 being parallel to and at a predetermined distance from the top surface of the bottom wall 21 of crucible 12. The retention portion is preferably in the form of a plurality of inwardly extending discrete ledge segments which are spaced apart from each other about the periphery of opening 41.

In the embodiment of FIGS. 1 and 9-11, the upper portion of the opening 41 in substrate wafer carrier 15 is rectangular with four corners. The retention portion of the substrate wafer carrier 15 comprises four discrete ledge segments 42, 43, 44 and 45, extending inwardly with respect to opening 41 so as to provide a generally triangular planar surface at each of the four corners of the upper portion of opening 41. The triangular planar surfaces, which are the upper surfaces of the ledge segments 42, 43, 44 and 45, are parallel to the crucible bottom wall 21, and thus provide accurate positioning surfaces for supporting the substrate wafer 16 in the upper portion of opening 41, with the bottom surface of the substrate wafer 16 being parallel to and at the predetermined distance from the bottom wall 21 of crucible 12, while maximizing the amount of the substrate surface which is exposed for the growth of the thin semiconductor film. While the discrete ledge segments 42, 43, 44, and 45 can be formed with the lower surfaces thereof flush with the lower surface 39 of substrate wafer carrier 15, it is presently preferred to form the lower portion of the substrate wafer carrier 15 so as to provide the ledge segments in the form of projections extending downwardly from the lower surface 39 with the triangular planar surfaces being at least substantially coplanar with the lower surface 39 of the substrate wafer carrier 15. The substrate wafer carrier 15 can be provided with a notch 46 in at least one edge thereof to permit the use of an instrument for inserting the substrate wafer carrier 15 into the cavity 26 and removing the substrate wafer carrier 15 from the cavity 26.

In an alternative substrate wafer carrier 115 illustrated in FIGS. 12-14, the rectangular opening 141 extending from upper surface 138 to lower surface 139 is adapted to contain a plurality of substrate wafers positioned in side-by-side relationship to each other. The upper portion of opening 141 is rectangular with four corners, and each of these corners has a ledge segment 142, 143, 144 or 145 associated therewith to provide the triangular supporting surfaces in the same manner as in the embodiment of FIGS. 9-11. Additional ledge segments 147 and 148 are positioned on opposite longitudinal sides of opening 141 so as to provide support for the adjacent corners of the pair of side-by-side substrate wafers. Each of ledge segments 147 and 148 can be provided with a divider element 149 which extends upwardly from the planar support surface so as to maintain a desired degree of separation between the adjacent edges of the side-by-side substrate wafers.

As illustrated in FIGS. 1, 15 and 16, the crucible lid 17 has a rim portion 51, an engagement portion 52, and a handle portion 53. The rim portion 52 rests on the top surface of each of the sidewalls 22, 23, 24, and 25 of the crucible 12, with the engagement portion 52 extending downwardly into cavity 26, while the handle portion 53 extends away from the crucible 12. The outer dimensions of rim portion 51 correspond to the outer dimensions of the top portions of the crucible sidewalls, while the outer dimensions of engagement portion 52 are only slightly less than the corresponding inner dimensions of the top portions of the crucible sidewalls. Thus, the lid 17 is positionable on the crucible sidewalls with the portion 52 being in at least partial engagement with the interior surface of the sidewalls so as to provide a semi-confined atmosphere in cavity 21, and the engagement portion 52 serves to retain the lid 17 in mating engagement with the crucible 12 and thereby prevent sliding of the lid 17 with respect to the crucible 12. The portion 53 can be used as a handle during the positioning of the lid 17 on the crucible 12 and during the removal of the lid 17 from the crucible 12. The handle portion 53 can also have a sufficient vertical height so that the lid and crucible assembly can be positioned within the cylindrical passage of the tube 11 with the outer top edges of the lid 17 being spaced from but in close proximity to the interior surface of tube 11 so that the lid 17 is retained in place on the crucible 12 while the assembly is within the passage of tube 11. The top surface of the lid 17 can be planar or it can be curved to at least generally conform to the interior surface of tube 11. However, the use of a lid having a handle portion with vertical sides is advantageous in visually aligning the growth vessel in the tube 11. An alternative crucible lid 117, illustrated in FIG. 17, comprises the rim portion 151 and the engagement portion 152 without the handle portion.

It is desirable that each of crucible 12, spacer 13, source tray 14, substrate wafer carrier 15, and lid 17 be formed of a material which is at least substantially chemically inert to vaporized source material. It is presently preferred that each of the elements be formed of graphite, and more preferably that each element be a single, integrally formed piece of high purity, high density graphite. The high purity, high density graphites sold by Poco Graphite Inc. as DFP3-2 or Fabmate grades are suitable materials. It is desirable that the graphite have a purity of at least 99.99% and a density of at least 1.75 gms/cm$^3$, and more preferably a purity of at least 99.999% and a density of at least 1.85 gms/cm$^3$. When the components are formed of high purity, high density graphite, they can be machined to a tolerance of ±0.01 mm. The formation of the spacers 13 of high purity, high density graphite is particularly advantageous in that such spacers can have a smaller thickness than can be produced with many other conventional materials for this environment, and the smaller thickness permits adjustments in finer intervals. A plurality of spacers 13 can be provided with different thicknesses so that a single spacer having the proper thickness can be selected in order to provide the desired distance between the source of growth materials and the substrate wafer. However, the use of a plurality of identical spacers of small thickness permits the desired spacing to be readily achieved without having to have a suitable single spacer for every application. A plurality of spacers of differing thicknesses can also be employed.

The use of the growth vessel of the present invention for the isothermal vapor phase epitaxy (ISOVPE) process permits the growth of highly uniform thin epitaxial films of binary or alloy semiconductors where the ISOVPE process can be used. The film uniformity can be measured in terms of film thickness and alloy composition variation over the growth area of a substrate wafer. Although this growth vessel design is applicable to thin film growth of various semiconductors or other materials, it has been specifically implemented in the growth of $Hg_{1-x}Cd_xTe$ alloys on CdTe or lattice matched $Cd_{1-y}Zn_yTe$ substrate wafers. For the implementation of such high uniformity growth process, finely powdered HgTe can be first sintered in the source tray 14 with a flat piece of graphite and a quartz weight covering the source tray to ensure that the source of growth material has a smooth, flat upper surface. The sintering can be performed at temperatures in the range of 750° C. to 800° C. at a pressure of 1200 psi of hydrogen gas in a furnace which is capable of withstanding the high pressures. Alternatively, a wafer of HgTe with a high degree of flatness, cut to fit the source tray 14, can be used as the source of growth materials. For the growth of the $Hg_{1-x}Cd_xTe$ alloy, one or more substrate wafers can be mounted on the substrate wafer carrier 15 or 115, with the growth surface facing the source tray 14. Using a particular growth vessel of the present invention with a HgTe source, either sintered or a wafer, in the source tray, the vertical spacing between the entire area of the growth area on the lower surface of the substrate wafer and the upper surface of the HgTe source can be varied between 1 mm and 5 mm using the flat graphite spacers, but maintained within ±0.05 mm. This tight tolerance in source to substrate wafer spacing can be critical for high thickness and compositional uniformity in the alloy growth. The $Hg_{1-x}Cd_xTe$ growth process itself can be performed at temperatures in the range of 450° C. to 550° C. under either closed high pressure or open tube conditions. Using a particular growth vessel of the present invention, epitaxial films of $Hg_{1-x}Cd_xTe$ on polished CdTe substrate wafers have been grown over 6 cm$^2$ area with thickness uniformity of 7.4±0.05 μm and composition uniformity, measured in terms of room temperature cutoff wavelength, of 6.3±0.05 μm. Similar uniformities on multiple wafers can also be achieved.

Reasonable variation and modifications are possible within the scope of the foregoing description, the drawings and the appended claims to the invention. For example, the substrate wafer carriers can be constructed with the opening 41 of any desired configuration, e.g., circular or oval or polygonal. Similarly, the crucible cavity, the spacers, the source tray, the substrate wafer carrier, and the lid can have a configuration other than rectangular. The ledge segments can have a curved innermost surface rather than the illustrated straight line surface. The lid, the substrate wafer carrier, and/or the crucible can be provided with a passageway to permit gas exchange between the crucible cavity and the exterior of the growth vessel.

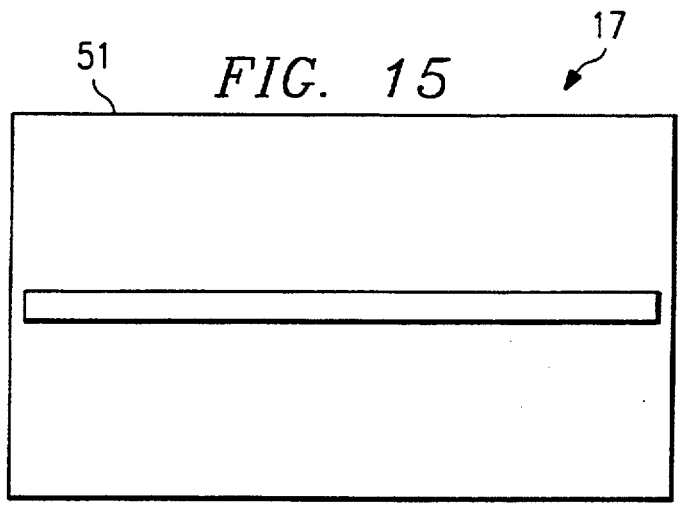

We claim:

1. A vessel for growing a thin film on a substrate I y isothermal vapor phase epitaxy, said vessel comprising:
   a crucible having a bottom wall and at least one sidewall extending upwardly from said bottom wall to form a cavity, said at least one sidewall having an interior supporting shoulder located below the top of said at least one sidewall, said interior supporting shoulder being spaced from and at least substantially parallel to said bottom wall;
   a source tray positionable within said cavity below said interior supporting shoulder for containing at least one source material to be vaporized in order to provide the material for the formation of the thin film on the substrate; and
   a substrate carrier positionable on said interior supporting shoulder so as to be supported thereby, said substrate carrier having an upper surface and a lower surface, said substrate carrier having an opening therein extending from said upper surface to said lower surface, the upper portion of said opening being of a size to accommodate at least one substrate therein, said substrate carrier having at least one retention portion for retaining the at least one substrate within the upper portion of the opening in said substrate carrier with the lower surface of the at least one substrate being parallel to and at a predetermined distance from bottom wall of said crucible.

2. A vessel in accordance with claim 1 further comprising a lid positionable on said at least one sidewall so as to provide a semi-confined atmosphere in said cavity.

3. A vessel in accordance with claim 1 wherein each of said crucible, said source tray, and said substrate carrier is formed of a material which is at least substantially chemically inert to vaporized source material.

4. A vessel in accordance with claim 1 further comprising a lid positionable on said at least one sidewall with a portion of said lid extending into said cavity so as to retain the position of said lid on said crucible, and at least one spacer positioned within said cavity between said bottom wall and said source tray, and wherein each of said crucible, said source tray, said substrate carrier, said at least one spacer, and said lid is formed of high purity, high density graphite.

5. A vessel in accordance with claim 1 wherein said at least one retention portion of said substrate carrier extends inwardly of said opening so as to form at least one support ledge having an upper support surface which is at least substantially parallel to said bottom wall of said crucible.

6. A vessel in accordance with claim 1 wherein said upper portion of the opening in said substrate carrier has a plurality of corners, and wherein said at least one retention portion comprises a plurality of inwardly extending discrete ledge segments, each of said corners having one of said ledge segments associated therewith to support said at least one substrate in said upper portion of said opening.

7. A vessel in accordance with claim 6 wherein said crucible has four sidewalls with said cavity being at least generally rectangular in configuration, wherein said interior supporting shoulder extends about the periphery of said cavity, wherein said substrate carrier is at least generally rectangular in configuration, and wherein said upper portion of the opening in said substrate carrier is at least generally rectangular with four corners.

8. A vessel in accordance with claim 7 wherein said upper portion of the opening in said substrate carrier is adapted to contain a plurality of substrates positioned in side-by-side relationship to each other, and wherein said at least one retention portion further comprises a pair of ledge segments positioned on opposite sides of said opening so as to support adjacent corners of an adjacent pair of substrates.

9. A vessel in accordance with claim 1 further comprising at least one spacer positioned within said cavity between said bottom wall and said source tray so as to reduce the distance between said source tray and the lower surface of the at least one substrate positioned on said substrate carrier.

10. A vessel in accordance with claim 9 further comprising a lid positionable on said at least one sidewall, with a portion of said lid extending into said cavity in at least partial engagement with the interior surface of said at least one sidewall.

11. A vessel in accordance with claim 10 wherein each of said crucible, said at least one spacer, said source tray, said substrate carrier, and said lid is a single, integrally formed piece of high purity, high density graphite.

12. A vessel in accordance with claim 11 wherein said lid has a handle portion, and wherein said lid fits onto said crucible with said handle portion extending away from said crucible so that the resulting assembly can be positioned within a cylindrical passage of a tube such that said lid is retained in place on said crucible while the assembly is within said passage.

13. A vessel in accordance with claim 12 wherein said at least one retention portion of said substrate carrier extends inwardly of said opening so as to form at least one support ledge having an upper support surface which is at least substantially parallel to said bottom wall of said crucible.

14. A vessel in accordance with claim 13 wherein said upper portion of the opening in said substrate carrier has a plurality of corners, and wherein said at least one retention portion comprises a plurality of inwardly extending discrete ledge segments, each of said corners having one of said ledge segments associated therewith to support said at least one substrate in said upper portion of said opening.

15. A vessel in accordance with claim 14 wherein said crucible has four sidewalls with said cavity being at least generally rectangular in configuration, wherein said interior supporting shoulder extends about the periphery of said cavity, wherein said substrate carrier is at least generally rectangular in configuration, and wherein said upper portion of the opening in said substrate carrier is at least generally rectangular with four corners.

16. A vessel in accordance with claim 15 wherein said upper portion of the opening in said substrate carrier is adapted to contain a plurality of substrates positioned in side-by-side relationship to each other, and wherein said at least one retention portion further comprises a pair of ledge segments positioned on opposite sides of said opening so as to support adjacent corners of an adjacent pair of substrates.

17. A vessel for growing a thin film on a substrate by isothermal vapor phase epitaxy, said vessel comprising:
    a crucible having a bottom wall and at least one sidewall extending upwardly from said bottom wall to form a cavity;
    a source tray, positionable within and removable from said cavity, for containing at least one source material to be vaporized in order to provide the material for the formation of the thin film on the substrate;
    a substrate carrier supported by said crucible at a predetermined distance above said bottom wall, said substrate carrier having an upper surface and a lower surface, said substrate carrier having an opening therein extending from said upper surface to said lower surface, the upper portion of said opening being of a size to accommodate at least one substrate therein, said substrate carrier having at least one retention portion for retaining the at least one substrate within the upper portion of the opening in said substrate carrier with the lower surface of the at least one substrate being parallel to and at a predetermined distance from said bottom wall of said crucible; and
    at least one spacer positioned within said cavity between said bottom wall and said source tray to thereby position said source tray at the desired distance from the lower surface of the at least one substrate positioned in said substrate carrier.

18. A vessel in accordance with claim 17 wherein said at least one spacer is formed of high purity, high density graphite.

19. A vessel in accordance with claim 18 further comprising a lid positionable on said at least one sidewall.

20. A vessel in accordance with claim 19 wherein each of said crucible, said at least one spacer, said source tray, said substrate carrier, and said lid is formed of a material which is at least substantially chemically inert to vaporized source material.

21. A vessel in accordance with claim 17 wherein said at least one retention portion of said substrate carrier extends inwardly of said opening so as to form at least one support ledge having an upper support surface which is at least substantially parallel to said bottom wall of said crucible.

22. A vessel in accordance with claim 17 wherein said at least one retention portion comprises a plurality of inwardly extending discrete ledge segments which are spaced apart from each other about the periphery of said opening.

23. A vessel in accordance with claim 17 wherein each of said crucible, said at least one spacer, said source tray, said substrate carrier, and said lid is a single, integrally formed piece of high purity, high density graphite.

* * * * *

UNITED STATES PATENT AND TRADEMARK OFFICE
CERTIFICATE OF CORRECTION

PATENT NO. : 5,266,118
DATED : November 30, 1993
INVENTOR(S) : Pradip Mitra and Julian L. Andries It is certified that error appears in the above-indentified patent and that said Letters Patent is hereby corrected as shown below:

On title page, item [75] after "Tex." add --and Julian L. Andries, Richardson, Tex.--

Column 7, line 28, change "I y" to --by--.

Signed and Sealed this

Twenty-fourth Day of May, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,266,118
DATED : November 30, 1993
INVENTOR(S) : Pradip Mitra and Julian L. Andries It is certified that error appears in the above-indentified patent and that said Letters Patent is hereby corrected as shown below:

The title page, showing an illustrative figure, should be deleted and substitute therefor the attached title page.

Signed and Sealed this

Sixteenth Day of April, 1996

Attest:

BRUCE LEHMAN

*Attesting Officer*          *Commissioner of Patents and Trademarks*

United States Patent [19]

Mitra

[11] Patent Number: 5,266,118
[45] Date of Patent: Nov. 30, 1993

[54] VESSEL FOR GROWING THIN FILMS BY ISOTHERMAL VAPOR PHASE EPITAXY

[75] Inventor: Pradip Mitra, Grand Prairie, Tex.

[73] Assignee: Loral Vought Systems Corporation, Grand Prairie, Tex.

[21] Appl. No.: 7,471

[22] Filed: Jan. 22, 1993

[51] Int. Cl.$^5$ ............................................. C23C 14/24
[52] U.S. Cl. ................................. 118/726; 118/728
[58] Field of Search .............................. 118/726, 728

[56] References Cited

U.S. PATENT DOCUMENTS

| | | | |
|---|---|---|---|
| 3,462,323 | 8/1969 | Groves | 148/175 |
| 4,447,470 | 5/1984 | Kay | 427/76 |
| 4,762,576 | 8/1988 | Wilson et al. | 156/611 |

OTHER PUBLICATIONS

Wang, Shin, Chu, Lanir and Vanderwyck, "Liquid Phase Growth of HgCdTe Epitaxial Layers", J. Electrochem. Soc. 127, pp. 175-179, Jan., 1980.
Shin and Pasko, "Open-Tube Isothermal Vapor Phase Epitaxy of $Hg_{1-x}Cd_xTe$ on CdTe", Appl. Phys. Lett., 44 (4), pp. 423-425, Feb. 15, 1984.
"Semiconductor/Opto-Electronic Grades", published by Poco Graphite, Inc., 4 pages, Mar., 1989.
"Fabmate", published by Poco Graphite, Inc., 2 pages, publication date unknown.

Primary Examiner—Richard Bueker
Attorney, Agent, or Firm—Richards, Medlock & Andrews

[57] ABSTRACT

A growth vessel (10) comprises a crucible (12) for containing the source materials within its cavity (26), a substrate carrier (15, 115) positioned on inner shoulder 27 of the crucible sidewalls (22-25), a source tray (14) positioned within the crucible cavity (26), at least one spacer (13) positioned between the bottom of the crucible cavity (26) and the source tray (14), a substrate carrier (15, 115) positioned within the crucible cavity (26) for mounting a substrate parallel to the source of growth material in the source tray (14), and a crucible lid (17, 117).

23 Claims, 3 Drawing Sheets

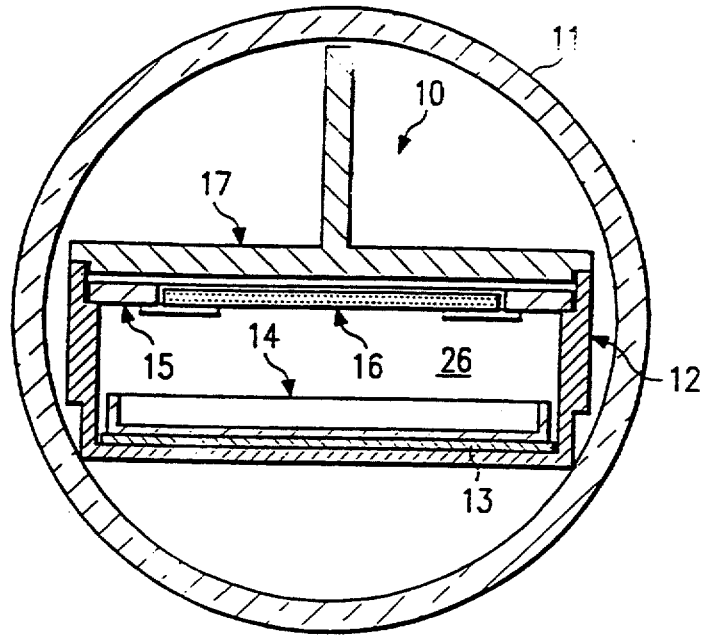

UNITED STATES PATENT AND TRADEMARK OFFICE
CERTIFICATE OF CORRECTION

PATENT NO. : 5,266,118  Page 3 of 4
DATED : November 30, 1993
INVENTOR(S) : Pradip Mitra and Julian L. Andries It is certified that error appears in the above-indentified patent and that said Letters Patent is hereby corrected as shown below:

Delete drawing Fig 1, and substitute therefor the drawing figure, consisting of Fig. 1, as shown below.

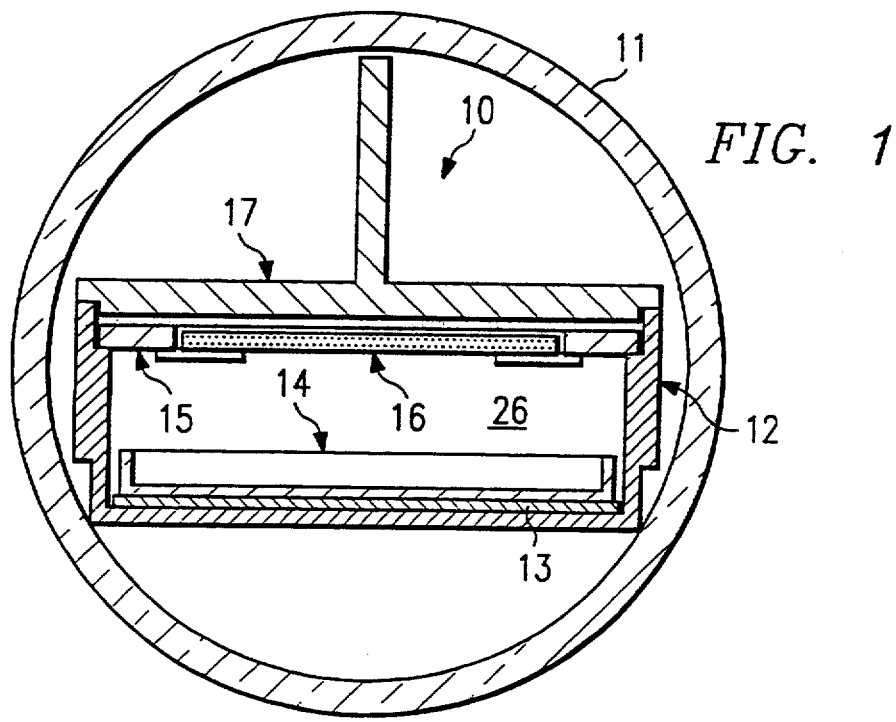

FIG. 1

UNITED STATES PATENT AND TRADEMARK OFFICE
CERTIFICATE OF CORRECTION

PATENT NO. : 5,266,118

DATED : November 30, 1993

INVENTOR(S) : Pradip Mitra and Julian L. Andries

It is certified that error appears in the above-indentified patent and that said Letters Patent is hereby corrected as shown below:

Delete drawing Fig. 15, and substitute therefor the drawing Figure, consisting of Fig. 15, as shown below.